US012275642B2

(12) United States Patent
Sakai et al.

(10) Patent No.: US 12,275,642 B2
(45) Date of Patent: Apr. 15, 2025

(54) SILICON CORE WIRE FOR DEPOSITING POLYCRYSTALLINE SILICON AND PRODUCTION METHOD THEREFOR

(71) Applicant: Tokuyama Corporation, Yamaguchi (JP)

(72) Inventors: Junya Sakai, Yamaguchi (JP); Seiji Katou, Yamaguchi (JP); Makoto Kamada, Yamaguchi (JP); Miki Emoto, Yamaguchi (JP)

(73) Assignee: Tokuyama Corporation, Yamaguchi (JP)

( * ) Notice: Subject to any disclaimer, the term of this patent is extended or adjusted under 35 U.S.C. 154(b) by 571 days.

(21) Appl. No.: 17/630,180

(22) PCT Filed: Jul. 29, 2020

(86) PCT No.: PCT/JP2020/029159
§ 371 (c)(1),
(2) Date: Jan. 26, 2022

(87) PCT Pub. No.: WO2021/024889
PCT Pub. Date: Feb. 11, 2021

(65) Prior Publication Data
US 2022/0281751 A1    Sep. 8, 2022

(30) Foreign Application Priority Data

Aug. 2, 2019   (JP) .................................. 2019-142726

(51) Int. Cl.
*C01B 33/035*   (2006.01)
*B23K 13/02*    (2006.01)
(Continued)

(52) U.S. Cl.
CPC ............ *C01B 33/035* (2013.01); *B23K 13/02* (2013.01); *C30B 29/06* (2013.01); *B23K 2103/56* (2018.08)

(58) Field of Classification Search
None
See application file for complete search history.

(56) References Cited

U.S. PATENT DOCUMENTS

| 8,444,800 B2 | 5/2013 | Nagaura et al. |
| 2012/0060562 A1 | 3/2012 | Wochner et al. |

(Continued)

FOREIGN PATENT DOCUMENTS

| CN | 101723369 A | 6/2010 |
| CN | 202379744 U | 8/2012 |

(Continued)

OTHER PUBLICATIONS

English translation of International Preliminary Report on Patentability, Feb. 3, 2022.

(Continued)

*Primary Examiner* — Jeffrey D Washville
(74) *Attorney, Agent, or Firm* — CAHN & SAMUELS, LLP

(57) ABSTRACT

A silicon core wire for depositing polycrystalline silicon is formed in a gate shape and includes a pair of vertical rod portions and a horizontal portion laterally connecting upper ends of the vertical rod portions, in which ends of the vertical rod portions and the horizontal portion are joined by welding, and a corner junction has a surface metallic concentration of 1 ppbw or less, more specifically, with an iron concentration of 0.2 ppbw or less, a chromium concentration of 0.1 ppbw or less, a nickel concentration of 0.05 ppbw or less, and a titanium concentration of 0.2 ppbw or less.

12 Claims, 5 Drawing Sheets

(51) Int. Cl.
*B23K 103/00* (2006.01)
*C30B 29/06* (2006.01)

(56) References Cited

U.S. PATENT DOCUMENTS

2012/0175613 A1  7/2012  Netsu et al.
2020/0263293 A1* 8/2020  Okada ................. C01B 33/035

FOREIGN PATENT DOCUMENTS

| | | |
|---|---|---|
| JP | S51073924 A | 6/1976 |
| JP | S63242339 A | 10/1988 |
| JP | 2011116634 A | 6/2011 |
| JP | 2012062243 A | 3/2012 |
| JP | 2018122340 A | 8/2018 |

OTHER PUBLICATIONS

English Abstract for JP2018122340 A, Aug. 9, 2018.
English Abstract for CN101723369 A, Jun. 9, 2010.
English Abstract for CN202379744 U, Aug. 15, 2012.
English Abstract for DE2505540A1, 2-10, 1975, corresponding to JPS5173924A.
English Abstract for JP2011116634 A, Jun. 16, 2011.
English Abstract for JP2012062243 A, Mar. 29, 2012.
English Abstract for JPS63242339, Jul. 10, 1988.

* cited by examiner

SILICON CORE WIRE FOR DEPOSITING POLYCRYSTALLINE SILICON AND PRODUCTION METHOD THEREFOR

This application is a U.S. national stage application of PCT/JP2020/029159 filed on 29 Jul. 2020 and claims priority to Japanese patent document 2019-142726 filed on 2 Aug. 2019, the entireties of which are incorporated herein by reference.

TECHNICAL FIELD

The present invention relates to a silicon core wire for depositing polycrystalline silicon, and specifically, to a silicon core wire that is formed in a gate shape and includes a pair of vertical rod portions and a horizontal portion laterally connecting upper ends of the two vertical rod portions.

BACKGROUND OF THE INVENTION

Polycrystalline silicon is useful as a raw material of a semiconductor or a photovoltaic power generation wafer. Various methods for producing such polycrystalline silicon are known, and for example, a method called a Siemens method is industrially carried out.

In general, in a typical Siemens method, first, a gate-shaped silicon core wire formed by a pair of vertical rod portions and a horizontal portion laterally connecting upper ends of the two vertical rod portions is installed on a bottom board in a reactor, and metal electrodes are fixed to ends of the silicon core wire via core wire holders. Then, these metal electrodes are energized to heat the silicon core wire to a silicon deposition temperature, and in this state, a raw material gas for depositing silicon containing a silane compound such as trichlorosilane ($SiHCl_3$) or monosilane ($SiH_4$) and a reducing gas is supplied into a reaction chamber, and silicon is deposited on the above silicon core wire by a chemical vapor deposition method. According to this method, polycrystalline silicon having a high purity can be obtained in a rod form.

The gate-shaped silicon core wire used in the Siemens method is produced by, for example, the following method. It is a method in which upper ends of the pair of vertical rod portion silicon rods are formed into V-shaped receiving structures, and ends of the horizontal portion silicon rod are placed and assembled to the V-shaped receiving structures (Patent Literature 1). However, the silicon core wire obtained by this method is poor in stability because corners of the silicon core wire form a structure in which the ends of the horizontal portion silicon rod are simply placed on the upper end receiving structures of the vertical rod portion silicon rods. Therefore, in initial energization during deposition of polycrystalline silicon, an arc due to a high voltage is likely to be generated, and peripheries of the corners may be melted.

On the other hand, the silicon core wire can also be obtained by heating a long rod member made of silicon to a high temperature (800° C. or higher) and softening and bending the long rod member (Patent Literatures 2 and 3). Since the silicon core wire obtained by this method has an integrated structure, the arc generation during the initial energization can be suppressed. However, an operation of heating the long rod member to a high temperature and bending the long rod member as described above is not easy, a complicated heat treatment apparatus is required, and an equipment cost increases. Moreover, in this method, a highly active silicon surface comes into contact with a metal surface of the apparatus or air during the above high-temperature heating, causing metal contamination of the silicon core wire.

As a method for producing the gate-shaped silicon core wire, it is also conceivable to weld the upper ends of the vertical rod portion silicon rods and the ends of the horizontal portion silicon rod. Here, the welding of silicon members is generally performed by high-frequency induction heating. The high-frequency induction heating is a method in which, by inserting an object to be heated made of a conductor into a work coil connected to an alternating current power source, an eddy current having a high density is generated near a surface of the object to be heated, thereby causing the surface of the object to be heated to self-heat by a Joule heat of the eddy current. By performing the high-frequency induction heating, melt drops are generated near abutting portions of ends of the silicon members to be joined, and these melt drops are integrated due to a surface tension and cooled so as to weld the silicon members.

However, in the welding of the silicon members by the high-frequency induction heating, only straight welding (linear welding) is known (Patent Literatures 4 to 6), and bending welding at a high angle such as a right angle welding, which is required for obtaining the gate-shaped silicon core wire, has not been performed. This is because, in order to perform the high-frequency induction heating, it is required to enclose a portion to be joined by the work coil, and when the portion to be joined has an angle in this state, it becomes difficult to put the portion to be joined into and out of the enclosure of the work coil, and the portion to be joined is contact with the work coil, causing metal contamination of the silicon core wire.

Further, since the welding by the above high-frequency induction heating is performed after preheating the portion to be joined, a preheater made of a carbon member must be arranged around the portion to be joined, and a risk of silicon core wire contamination due to contact of the silicon member with the preheater is increased.

Here, the reason why the portion to be joined is required to be preheated prior to the welding by the high-frequency induction heating is that since a specific resistance of silicon at room temperature is 10,000 Ωcm or more, no eddy current is generated even if a high frequency is directly applied to silicon at room temperature. Therefore, the above preheater is required to be inserted into a gap between the work coil and the portion to be joined, and in this state, first, a high frequency is applied to the work coil, the preheater is heated to 1500° C. or more by the high-frequency induction heating, and the portion to be joined is heated to at least 100° C. Accordingly, the specific resistance of the portion to be joined drops to several Ωcm and the eddy current starts to be generated, and then the preheater is moved away, the high frequency from the work coil is concentrated on the portion to be joined, and the welding is performed.

In such a circumstance, a method according to Patent Literature 7 has been proposed as a method in which, even when the portion to be joined is to be bent and welded at a high angle, there is no concern about the contact with the work coil and the carbon member and the operation can be easily performed. As a method in which the weld portion of the silicon core wire can be welded at a right angle, Patent Literature 7 discloses a method using a silicon core wire welding apparatus characterized by including a work coil connected to a high frequency generator and capable of outputting an alternating magnetic field, a shape of the work coil from one terminal to the other terminal is arranged so as to have a portion that is bent to form a space capable of inserting the welded portion of the silicon core wire and open in one direction, and heating of the silicon core wire is performed in the space by the alternating magnetic field ([Claim 1]). Patent Literature 7 also discloses a structure in which the above silicon core wire welding apparatus includes a preheating carbon member mounted to be able to be taken into and out of the space, located near the silicon core wire when inserted into the space, and heated by the alternating magnetic field to preheat the silicon core wire ([Claim 4]).

The structure and arrangement of the above work coil and the preheating carbon member in the silicon core wire welding apparatus are skillfully devised such that there is no risk that ends to be joined come into contact with the work coil and the preheating carbon member, not only in straight welding but also in at right angle welding (in particular, [0055] to [0083] and Figures. 8 to 10 of Patent Literature 7). Patent Literature 7 also discloses that surroundings are filled with an inert gas during welding using the above silicon core wire welding apparatus ([0062]), and thus the joined portion is prevented from coming into contact with air at a high temperature during the welding.

CITATION LIST

Patent Literature

Patent Literature 1: CN 202379744 U
Patent Literature 2: JP-A-S51-073924
Patent Literature 3: CN 101723369 A
Patent Literature 4: JP-A-S63-242339
Patent Literature 5: JP-A-2011-116634
Patent Literature 6: JP-A-2012-62243
Patent Literature 7: JP-A-2018-122340

SUMMARY OF INVENTION

Technical Problem

However, even in the silicon core wire produced by using the above silicon core wire welding apparatus according to Patent Literature 7, a surface metallic concentration of a corner junction where ends of the vertical rod portion and the horizontal portion are welded could not have been sufficiently reduced. That is, such a corner junction has a surface metallic concentration of about several to several tens of ppbw, although contact with the work coil and the preheater is prevented and the purity is considerably high. In recent years, high-density integration of electronic circuits has been progressing more and more, and accordingly, a demand for reducing metal contamination has been further increased for polycrystalline silicon, which is a raw material for semiconductor wafers. Therefore, a high purity is extremely strongly required for a silicon core wire for depositing polycrystalline silicon, and even a slight contamination of the corner junction is required to be improved.

The present invention has been made in consideration of the above circumstances, and an object thereof is to achieve a higher-level reduction in surface metallic concentration at a corner junction of a gate-shaped silicon core wire for depositing polycrystalline silicon.

SUMMARY OF THE INVENTION

In view of the above technical problems, the present inventors have intensively studied to solve the problems. As a result, the present inventors have succeeded in producing a silicon core wire in which a higher-level reduction in surface metal contamination of corner junctions is achieved, and have completed the present invention.

That is, the present invention provides a silicon core wire for depositing polycrystalline silicon formed in a gate shape including a pair of vertical rod portions and a horizontal portion laterally connecting upper ends of the two vertical rod portions, in which ends of the vertical rod portions and the horizontal portion are joined by welding, and a corner junction has a surface metallic concentration of 1 ppbw or less.

Further, as a method for producing the above silicon core wire for depositing polycrystalline silicon, the present invention also provides a method for producing the silicon core wire for depositing polycrystalline silicon, including joining the pair of vertical rod portion silicon rods and the horizontal portion silicon rod into the gate shape, in which the ends of the vertical rod portion silicon rods and the horizontal portion silicon rod are joined to each other, in an inert gas atmosphere, by 1) preheating by a preheater formed of a carbon member having a metallic concentration of 1 ppmw or less, and then 2) welding by performing high-frequency induction heating.

In the silicon core wire according to the present invention, the ends of the vertical rod portions and the horizontal portion are integrally joined by welding, and the corners are excellent in stability. Therefore, in initial energization at the start of polycrystalline silicon deposition, no arc is generated even when a high voltage is applied, and peripheries of the corners are difficult to melt.

Further, the surface metallic concentration of the above corner junction is at a low level of 1 ppbw or less. Therefore, when the silicon core wire is used as a core wire, polycrystalline silicon having a high purity can be obtained, and single crystal silicon produced by using polycrystalline silicon as a raw material has a high purity and is extremely useful in industry.

DESCRIPTION OF EMBODIMENTS

Figure 1:
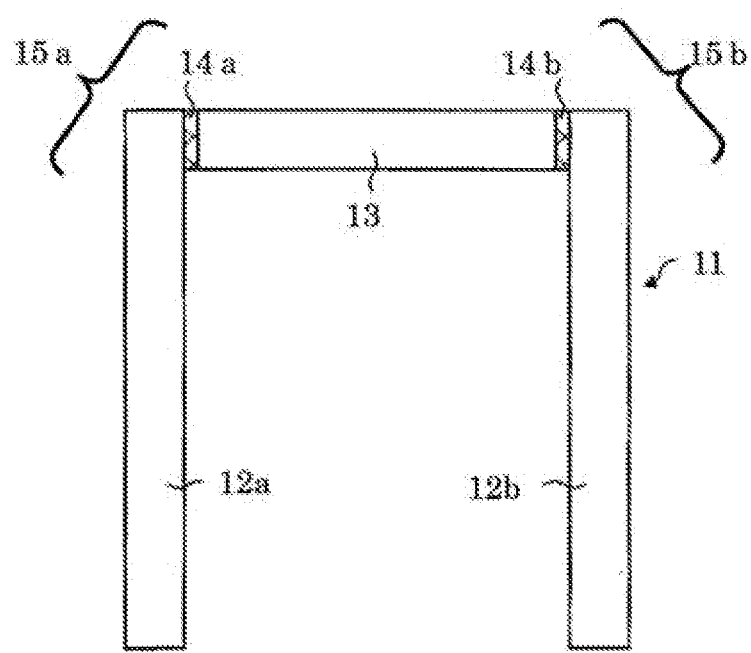
FIG. 1 is a front view illustrating a typical example of a silicon core wire for depositing polycrystalline silicon according to the present invention.

A silicon core wire according to the present invention is used for depositing polycrystalline silicon, and is formed in a gate shape including a pair of vertical rod portions (12*a*, 12b) and a horizontal portion (13) laterally connecting upper ends of the vertical rod portions (12a, 12b), as illustrated in a typical example in FIG. 1. Ends are welded to each other at joined portions (14a, 14b) of the above vertical rod portions (12a, 12b) and horizontal portion (13). The above silicon core wire (11) may be made of single crystal silicon cut out from a single crystal silicon ingot. However, in general, the silicon core wire is preferably made of polycrystalline silicon cut out from a polycrystalline silicon rod obtained by a Siemens method or the like, for a reason that the single crystal silicon core wire is prone to a creep deformation at high temperature. The vertical rod portions and the horizontal portion cut out from the polycrystalline silicon rod is stored in a clean room until use after surfaces thereof are etched with a fluoronitric acid solution or the like, washed with pure water, and dried.

Shapes of the vertical rod portions (12a, 12b) and the horizontal portion (13) forming the silicon core wire are not particularly limited, and may be, for example, a cylinder, an elliptic cylinder, a quadrangular prism, and a polygonal prism other than the quadrangular prism. A cross-sectional area of the silicon core wire is preferably 0.1 cm² to 6 cm², and more preferably 0.3 cm² to 2 cm². A length of each of the vertical rod portions (12a, 12b) is generally 0.5 m to 3 m, more preferably 1 m to 2.5 m, and a length of the horizontal portion (13) is generally 0.15 m to 0.40 m, more preferably 0.20 m to 0.30 m.

Figure 2:
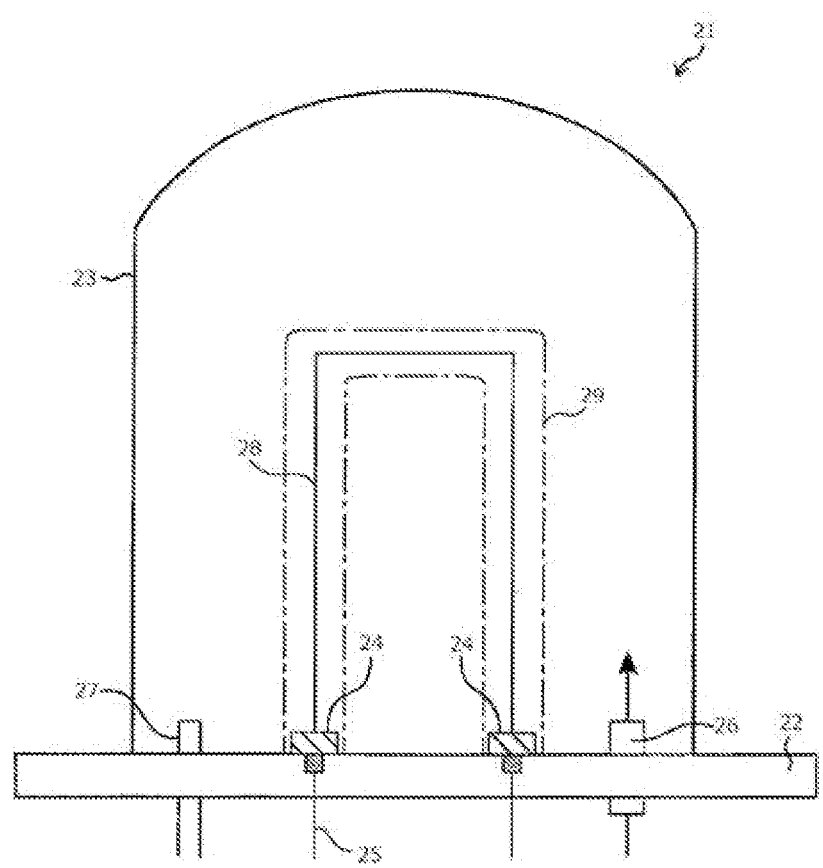
FIG. 2 is a cross-sectional view illustrating an outline of a polycrystalline silicon production reactor used in producing polycrystalline silicon by a Siemens method.

Production of polycrystalline silicon by the Siemens method using the silicon core wire is carried out by the following method using a polycrystalline silicon production reactor illustrated in a cross-sectional view in FIG. 2. A polycrystalline silicon production reactor (21) includes a bottom plate [bottom board] (22) and a bell jar-type cover (23) detachably coupled to the bottom plate (22). The bottom plate (22) is fitted with a raw material gas supply port (26) for supplying a raw material gas into the reactor (21) and a waste gas discharge port (27) for discharging a waste gas which is a gas after a reaction in the reactor (21).

The above raw material gas is a mixed gas containing a silane compound gas and hydrogen. Examples of the silane compound include chlorosilane compounds such as trichlorosilane ($SiHCl_3$), and monosilane ($SiH_4$).

The bottom plate (22) is provided with at least a pair of metal electrodes (24). The silicon core wire (28) is connected to the above metal electrodes (24) via core wire holders (not illustrated). Each of the metal electrodes (24) is electrically connected to a power supply unit (25). Accordingly, the silicon core wire (28) is energized and heated, and polycrystalline silicon is deposited on a surface of the silicon core wire to form a polycrystalline silicon rod (29).

The most characteristic feature according to the present invention is that corner junctions (15a, 15b) of the ends of the vertical rod portions (12a, 12b) and the horizontal portion (13) in the silicon core wire for depositing polycrystalline silicon have a surface metallic concentration of 1 ppbw or less. The surface metallic concentration is more preferably 0.1 ppbw to 0.8 ppbw.

When welding the ends of the vertical rod portions and the horizontal portion, melt drops are generated near abutting portions of ends of vertical rod portion silicon rods and a horizontal portion silicon rod to be welded, and the melt drops are integrated due to a surface tension and then cooled to form the joined portions (14a, 14b). In the silicon core wire, the above corner junctions are corner regions including joined portions obtained by integrating the melt drops. Due to melting, the portions joined by cooling the melt drops are excellent in smoothness and have a higher metallic luster as compared with other cut surfaces in the silicon core wire, and can be easily identified. In general, there is a mixed crystal composed of a plurality of crystals such as a single crystal or a twin crystal near each of the joined portion, whereas there is a polycrystal composed of crystal grains of several to several hundreds of microns on other surface portions. Therefore, the joined portions can be distinguished from other portions as portions having an enhanced crystallinity.

As described above, when welding the ends of the vertical rod portion silicon rods and the horizontal portion silicon rod by high-frequency induction heating, even with a method shown in Patent Literature 7, the surface metallic concentration of the welded portion is high, and the surface metallic concentration cannot be sufficiently lowered at the obtained corner junctions. In contrast, in the present invention, a reduction in surface metallic concentration of the corner junction is achieved by making a metallic concentration of a carbon member of a preheater low in a silicon core wire welding apparatus in which the high-frequency induction heating is performed, which will be described later.

In the silicon core wire, a surface metallic concentration of a part other than the corner junction is also preferably 1 ppbw or less, more preferably 0.1 ppbw to 0.8 ppbw, and particularly preferably 0.1 ppbw to 0.5 ppbw.

In the present invention, target metal elements of the surface metallic concentration include 18 elements of iron, chromium, nickel, sodium, magnesium, aluminum, potassium, calcium, cobalt, copper, zinc, tungsten, titanium, molybdenum, vanadium, manganese, strontium, and barium. Among them, it is preferable that respective concentrations of iron, chromium, nickel, and titanium are low, and specifically, an iron concentration is 0.2 ppbw or less, a chromium concentration is 0.1 ppbw or less, a nickel concentration is 0.05 ppbw or less, and a titanium concentration is 0.2 ppbw or less. Particularly preferably, the iron concentration is 0.01 ppbw to 0.15 ppbw, the chromium concentration is 0.01 ppbw to 0.08 ppbw, the nickel concentration is 0.01 ppbw to 0.03 ppbw, and the titanium concentration is 0.01 ppbw to 0.15 ppbw.

In the present invention, a method for measuring the surface metallic concentration of the corner junction of the silicon core wire will be described in detail in Examples. Further, as will be described later, a surface metallic concentration of a corner junction (joined portion of members) of the horizontal portion obtained by joining a plurality of horizontal portion silicon rod members is also measured by the same measurement method.

An outline of the method for measuring the surface metallic concentration of the corner junction is as follows. An analysis sample including the corner junction and a blank sample (not including the corner junction) having a weight substantially same as that of the analysis sample are cut out from the same silicon core wire. The analysis sample is observed and a weight of a welded portion in the corner junction is estimated. As described above, since the joined portion (welded portion) is clearly different from other portions in appearance, the joined portion can be easily distinguished. These samples can be easily cut out by making notches at predetermined positions of the silicon core wire by using a polycrystalline silicon piece and striking peripheries of the notches.

The surface metallic concentration is measured by dissolving portions each having a depth of 100 micrometers from surfaces of the analysis sample and the blank sample with a mixed solution (fluoronitric acid solution) of hydrofluoric acid and nitric acid, and measuring metal component amounts (weights) in the solution by inductively coupled plasma mass spectrometry (ICP-MS). That is, based on the metal component amounts and the weights of the analysis sample and the blank sample, and a weight of the welded portion of a measurement corner, the surface metallic concentration at the welded portion of the corner junction can be obtained according to a method of Examples described later. That is, the surface metallic concentration of the corner junction according to the present invention refers to the surface metallic concentration at the welded portion of the corner junction.

In the above measurement of the surface metallic concentration, the method of dissolving the surface of the analysis sample at a depth of 100 micrometers with the fluoronitric acid solution may be carried out by a method in which a polycrystalline silicon piece group having a controlled shape and size are allowed to be present in a dissolution tank in advance, a weight change of the polycrystalline silicon piece group before and after the dissolution treatment is measured so as to control a dissolution depth in the dissolution treatment of an actual object to be dissolved. A desired dissolution depth can be obtained by calculating a dissolution rate based on the weight change of the polycrystalline silicon piece group, and adjusting a dissolution treatment time of the analysis sample and the blank sample based on the dissolution rate. This method is known from the WO2018/198947 pamphlet, and method can be carried out according to the detailed description.

A method for producing the silicon core wire according to the present invention is not particularly limited as long as a low surface metallic concentration of the corner junction is achieved. According to a preferred production method, the ends of the vertical rod portion silicon rods and the horizontal portion silicon rod are joined to each other, in an inert gas atmosphere, by 1) preheating by a preheater formed of a carbon member having a metallic concentration of 1 ppmw or less, and then 2) welding by performing high-frequency induction heating.

In this production method, the method for preheating a portion to be joined with the preheater formed of the carbon member and then welding by the high-frequency induction heating in the inert gas atmosphere can be carried out according to the method described in Patent Literature 7. In this method, the portions to be joined including the ends of the vertical rod portion silicon rods and the horizontal portion silicon rod can be welded to each other without being brought into contact with the preheater and the work coil for the high-frequency induction heating at all, and metal contamination due to contact with each of the above heating members can be suppressed, which is particularly preferable.

Figure 4:
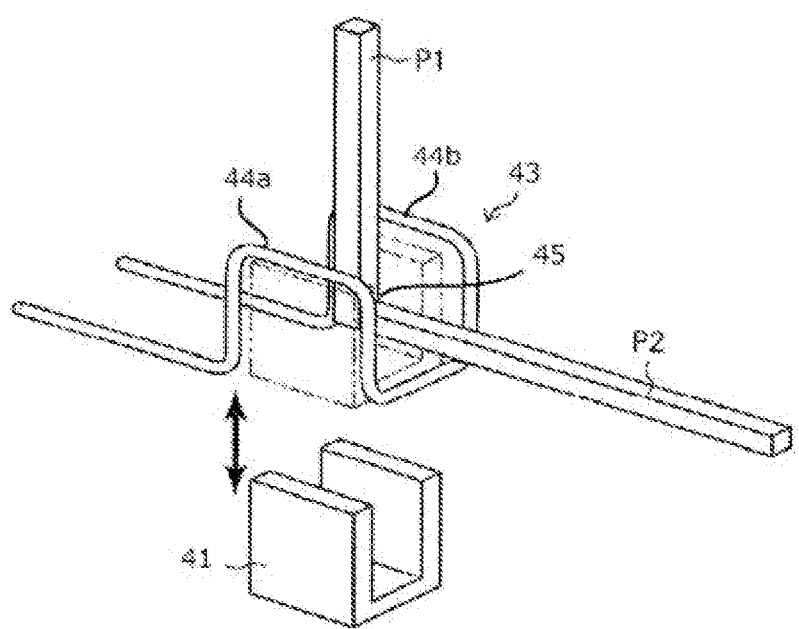
FIG. 4 is a perspective view illustrating a structure of a work coil and a preheating carbon member in a silicon core wire welding apparatus illustrated in FIG. 8a of Patent Literature 7.

Specifically, it is preferable to use a silicon core wire welding apparatus having a structure including a work coil and a preheating carbon member, which is illustrated in FIG. 8 as [Embodiment 2] in Patent Literature 7. FIG. 8(a) in Patent Literature 7 is transcribed as FIG. 4 in the present application. That is, FIG. 4 is a diagram based on a perspective view illustrating the structure including the work coil and the preheating carbon member in the silicon core wire welding apparatus illustrated as FIG. 8(a) in Patent Literature 7. As illustrated in FIG. 4, with respect to a work coil (43) that is bent to form a first inverted U-shaped portion (44a) and a second inverted U-shaped portion (44b), a C-shaped preheater (41) can be inserted into the work coil (43) so as to be parallel to a plane formed by the first inverted U-shaped portion (44a) and a plane formed by the second inverted U-shaped portion (44b) with a C-shaped opening facing a traveling direction. At that time, a portion to be joined (45) of the silicon members (P1, P2 [a vertical rod portion silicon rod, a horizontal portion silicon rod]) is accommodated in the C-shape of the preheater (41), and the preheater (41) sandwiches the portion to be joined (45). That is, a portion where the silicon core wire (P1 and P2) is to be inserted and a portion where the preheater (41) is to be inserted are open in the work coil (43), and the portion to be joined (45) of the silicon core wire (P1 and P2) can be put in and out without coming into contact with the preheater (41) and the work coil (43). As a result, even using the preheater (41), not only straight welding, but also bending welding at a high angle such as right angle welding can be performed.

In order to obtain the silicon core wire according to the present invention, it is important to make the metallic concentration in the carbon member forming the preheater 1 ppmw or less in the above production method. A metal content in the carbon member is more preferably 0.1 ppmw to 0.4 ppmw, and particularly preferably 0.1 ppmw to 0.3 ppmw. According to this configuration, the obtained silicon core wire does not come into contact with the preheater, and volatilization of metal impurities is suppressed even in a high temperature environment during preheating, so that the specified low surface metallic concentration can be achieved.

In the welding of the portion to be joined (45) using the silicon core wire welding apparatus shown in Patent Literature 7, during preheating, the preheater (41) is heated to a high temperature of at least 1500° C. by the high-frequency induction heating from the work coil (43) on the outside of the preheater, and thus when a metal element is contained in the carbon member forming the preheater (41) at this time, the metal element volatilizes and is dissipated as metal vapor. Since the portion to be joined (45) is present close to the preheater (41), contact with the metal vapor is a cause of metal contamination on a surface of the corner junction in a silicon core wire. The present inventers has found this fact and made the metal content in the carbon member forming the preheater low, thereby highly preventing this contamination.

Target metal elements contained in the carbon member also include 18 elements of iron, chromium, nickel, sodium, magnesium, aluminum, potassium, calcium, cobalt, copper, zinc, tungsten, titanium, molybdenum, vanadium, manganese, strontium, and barium. Among them, it is preferable that respective concentrations of iron, chromium, nickel, and titanium are low, and specifically, the iron concentration is 50 ppbw or less, the chromium concentration is 5 ppbw or less, the nickel concentration is 50 ppbw or less, and the titanium concentration is 30 ppbw or less. Particularly preferably, the iron concentration is 1 ppbw to 40 ppbw, the chromium concentration is 1 ppbw to 4 ppbw, the nickel concentration is 1 ppbw to 45 ppbw, and the titanium concentration is 1 ppbw to 20 ppbw.

In the present invention, the metal content in the carbon member refers to a value obtained by a combustion ashing method. The combustion ashing method is a measurement method in which a carbon sample is placed on a platinum board and heated in an oxygen atmosphere and burnt to be ashed, and a residue is dissolved in nitric acid to quantify elements by ICP-MS.

The metal content in a carbon member used in a heater application or the like is generally about 10 ppmw to 20 ppmw, and there is no known prior art in which a carbon member having a metal content as low as specified in the present invention is used for welding the above silicon core wire. Such a carbon member having a low metal content may be used by selecting such a high-purity product from commercially available products, or may be used by subjecting a product having a metal content exceeding a value specified in the present invention to a high temperature chlorination treatment and reducing the metal content into a range specified in the present invention.

A thickness of the carbon member forming the preheater is preferably 1.0 mm to 1.5 mm in consideration of ease of insertion into a gap between the portion to be joined and the work coil and mechanical strength.

The work coil for high-frequency induction heating preferably has an outer diameter of 1 mm to 3 mm. The work coil preferably has a tubular shape for cooling, and has a structure capable of cooling the inside of the tube with a water flow.

In the above production method, joining of the portion to be joined is carried out by 1) preheating and 2) high-frequency induction heating in the inert gas atmosphere. Argon, helium or the like can be used as the inert gas. These inert gases can be introduced by arranging the portion to be joined of the silicon core wire in the silicon core wire welding apparatus and replacing an atmosphere in the apparatus with these inert gases prior to carrying out preheating. It is also preferable to adopt a flow system in which the inert gas is injected into the apparatus from one wall at a predetermined flow rate and discharged from a wall in an opposite direction until the high-frequency induction heating is completed.

Regarding 1) preheating, the preheater is preferably present at a position close to the portion to be joined from a viewpoint of improving heating efficiency. If the preheater is too close to the portion to be joined, there is a risk of contact when the portion to be joined made of silicon is heated and expands, and thus the preheater generally has distance of 0.5 mm to 1.5 mm, and more preferably 0.7 mm to 1.2 mm from the joining portion.

For the same reason, the work coil for the 2) high-frequency induction heating is also preferably present at a position close to the portion to be joined, and generally has distance of 0.5 mm to 1.5 mm, and more preferably 0.7 mm to 1.2 mm from the joining portion.

During 1) preheating, as described above, the preheater is heated to a high temperature of at least 1500° C., more preferably 1500° C. to 2000° C. by the high-frequency induction heating from the work coil outside the preheater, and the portion to be joined is heated to a temperature of 100° C. or higher, and more preferably a temperature of 200° C. to 300° C. By heating the portion to be joined to 100° C. or higher, a specific resistance is lowered and an eddy current is generated, which enables the high-frequency induction heating of the portion to be joined. A heating time is generally 2 minutes to 5 minutes.

Next, during the 2) high-frequency induction heating, when welding the portion to be joined by using the silicon core wire welding apparatus shown in Patent Literature 7, the ends of the vertical rod portion silicon rods and the horizontal portion silicon rod are welded by, moving the preheater away from the portion to be joined, concentrating a high frequency from the work coil on the portion to be joined, generating an eddy current having a high density near the surface of the portion to be joined, and causing a surface of an object to be heated to self-heat with a Joule heat generated by the eddy current. A heating time is generally 10 seconds to 40 seconds.

Since the high-frequency induction heating is performed in a narrow space including a case where the preheater is heated by 1) preheating, the higher the frequency is, the more preferable. Specifically, the frequency is preferably 1 MHz or more, more preferably 1.5 MHz to 3 MHz, and particularly preferably 2 MHz to 2.5 MHz. The maximum output is preferably 1 KW or more, more preferably 3 KW to 10 KW, and particularly preferably 4 KW to 6 KW.

The ends of the vertical rod portion silicon rods and the horizontal portion silicon rod may be joined by bringing desired portions of both ends into contact with each other and welding. In order to more firmly weld the vertical rod portion silicon rods and the horizontal portion silicon rod, it is particularly preferable to performing welding by bringing side end surfaces of the silicon rod for the horizontal portion (13) into contact with inner surfaces of upper ends of the silicon rods for the vertical rod portions (12a, 12b) as in the form of the silicon core wire illustrated in FIG. 1, or it is also preferable to performing welding by bringing lower side surfaces of side ends of the horizontal portion silicon rod into contact with upper end surfaces of the vertical rod portion silicon rods.

It is preferable that in the silicon core wire for depositing polycrystalline silicon according to the present invention having the above configuration, the horizontal portion is formed by joining at least two horizontal portion silicon rod members in an upward bent shape. That is, during depositing polycrystalline silicon by using a core wire having a structure in which a straight rod-shaped horizontal portion is horizontally coupled to upper ends of a pair of vertical rod portions, in other words, a structure in which the end portions of the vertical rod portions and the end portion of the horizontal portion are joined at a right angle, thermal radiation is large on inner surfaces of the corner junction, so that overheating occurs near the corner junction, the depositing is unstable, and an abnormal depositing portion called popcorn is likely to occur. In order to make an improvement, it is effective to form the horizontal portion into an upward bent shape and make an angle of the corner junction formed by the ends of the vertical rod portions and the end of the horizontal portion more gradual than a right angle, thereby mitigating the thermal radiation on the inner surfaces of the corner junction.

Therefore, in the conventional silicon core wire, the horizontal portion is subjected to an upward direction bending process in a softened state by the high-temperature heating. However, as described above, such a bending process at a high temperature is not easy. Therefore, it is preferable to form the horizontal portion into an upward bent shape by joining at least two horizontal portion silicon rod members by welding, whereby the angle of each of the corner junctions formed by the ends of the vertical rod portions and the horizontal portion is formed to be larger than a right angle, and an effect of suppressing the popcorn generation is exhibited. When the angle of each of the corner junctions formed by the ends of the vertical rod portions and the horizontal portion is formed larger than a right angle in this way, an angle of at least one corner junction present in a middle of the horizontal portion is preferably 90 degrees or more and 170 degrees or less.

Figure 5:
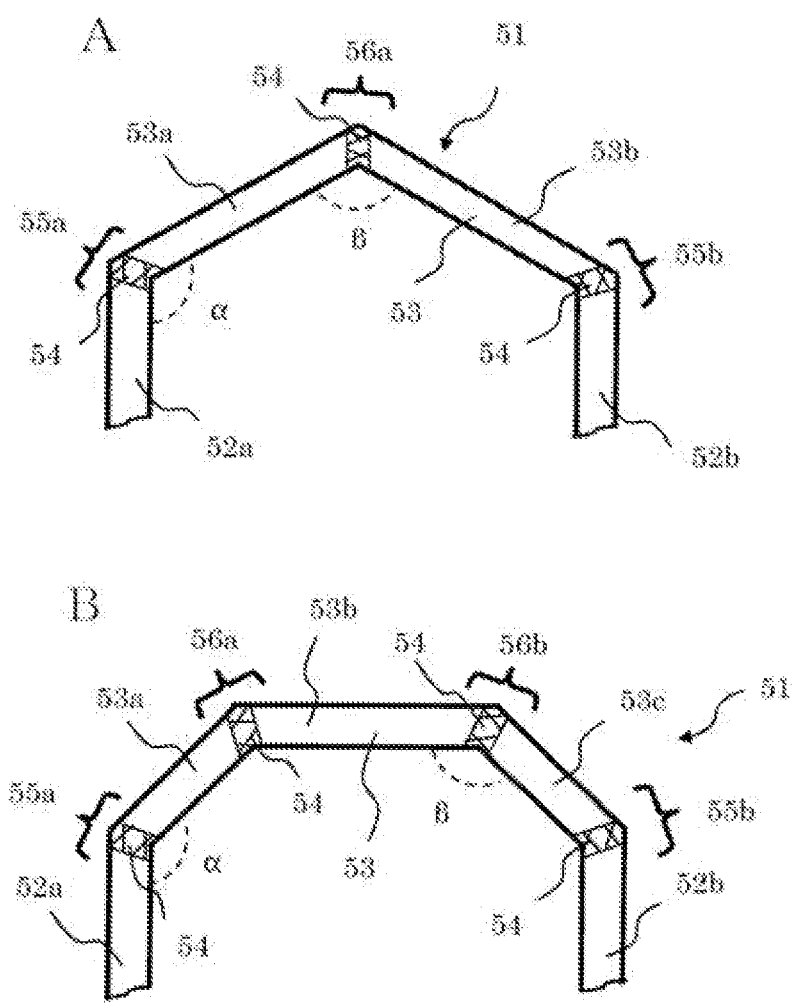
FIG. 5 shows front views illustrating representative forms of a horizontal portion of the silicon core wire for depositing polycrystalline silicon according to the present invention in a case where the horizontal portion is formed by joining at least two horizontal portion silicon rod members to an upward bent shape (A: two horizontal portion silicon rod members, B: three horizontal portion silicon rod members).

For describing the above structure in detail, as illustrated in a front view A of a silicon core wire upper portion (51) in FIG. 5, in a horizontal portion (53), two horizontal portion silicon rod members (53a, 53b) are welded at corner junctions (55a, 55b) and joined in an upward bent shape. Accordingly, the corner junctions (55a, 55b) formed by ends of the vertical rod portions (52a, 52b) and the horizontal portion (53) are joined at an angle larger than a right angle. In a front view B in FIG. 5, in the horizontal portion (53), three horizontal portion silicon rod members (53a, 53b, 53c) are joined into an upward bent shape, and accordingly the corner junctions (55a, 55b) formed by the ends of the vertical rod portions (52a, 52b) and the horizontal portion (53) are joined at an angle larger than a right angle.

An angle α of each of the corner junctions (55a, 55b) formed by the vertical rod portions (52a, 52b) and the horizontal portion (53) is an angle larger than a right angle, and the larger the angle α is preferable to effectively suppress the abnormal deposition due to thermal radiation in the corner junctions. However, when the angle α is too large, an angle β of each of the corner junctions (56a, 56b) in the middle of the horizontal portion formed by joining the horizontal portion silicon rod members (53a, 53b, 53c) is small, and the abnormal deposition due to thermal radiation may occur at the corner junctions in the middle of the horizontal portion. Therefore, when the angle of each of the corner junctions (55a, 55b) formed by the vertical rod portions (52a, 52b) and the horizontal portion (53) is 130 degrees or more and 170 degrees or less, all of the corner junctions (including the corner junctions formed by the vertical rod portions and the horizontal portion, and the corner junctions in the middle of the horizontal portion) can be adjusted to the above suitable angle, and the effect of suppressing the generation of popcorn can be more effectively exhibited. Hereinafter, the corner junction between the vertical rod portion and the horizontal portion may be referred to as a "vertical rod portion-horizontal portion corner junction", and the corner junction in the middle of the horizontal portion may be referred to as a "horizontal portion intermediate corner junction".

When there are two horizontal portion silicon rod members (53a, 53b) as illustrated in the front view A, the corner junction (56a) is at one position, and the angle β of the corner junction in the middle of the horizontal portion is a value obtained by subtracting, from 180 degrees, a total angle of portions of the corner junctions (55a, 55b) formed by the ends of the vertical rod portions (52a, 52b) and the horizontal portion (53) exceeding a right angle. When there are three or more horizontal portion silicon rod members, the corner junctions (56a, 56b) are at two or more positions. The angles of each joined portion may be actually measured, or may be obtained from an image by taking a photograph.

The most preferable form of the horizontal portion in the present invention is that the horizontal portion is formed by joining three to six horizontal portion silicon rod members, and the angle of α of each corner junction formed by the ends of the vertical rod portions and the horizontal portion and the angle β of each of the corner junctions in the middle of the horizontal portion are both in a range of 130 degrees or more and 170 degrees or less.

Further, in the present invention, the surface metallic concentration of each corner junction in the middle of the horizontal portion is also 1 ppbw or less, and more preferably 0.1 ppbw to 0.8 ppbw, which is particularly preferable from a viewpoint of producing polycrystalline silicon having a high purity.

The low surface metallic concentration in the middle of the horizontal portion can be satisfactorily achieved by performing the joining of ends of the horizontal portion silicon rod members by a method in which the portions to be joined are joined to each other, in an inert gas atmosphere, by 1) preheating by the preheater formed of the carbon member having a metallic concentration of 1 ppmw or less, and then 2) welding by performing the high-frequency induction heating, in the same manner as in the case of joining the vertical rod portion silicon rods and the horizontal portion silicon rod.

EXAMPLES

Hereinafter, examples will be shown to more specifically explain the present invention, but the present invention is not limited to these examples. In Examples and Comparative Examples, physical property values were obtained by the following methods.

1) Surface Metallic Concentration of Corner Junction in Silicon Core Wire

Figure 3:
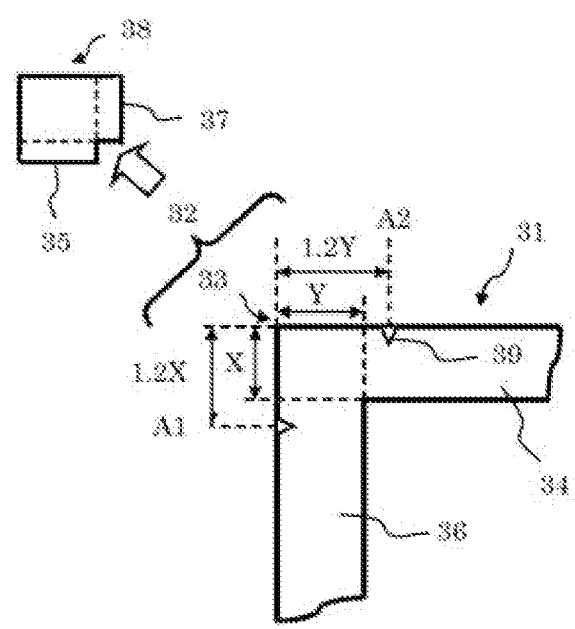
FIG. 3 is a front view of an upper portion of a typical example of a silicon core wire for depositing polycrystalline silicon.

An analysis sample was collected from a corner junction of a silicon core wire according to a method shown in FIG. 3. That is, an analysis sample (38) was cut out from a corner junction (32), and the sample included a vertical cross section (vertical rod portion side cross section of the analysis sample; 35) vertical to an axial direction of the horizontal portion (34) at a position (A1) where an outer end side of the vertical rod portion was lowered by a length (1.2X) of about 1.2 times a vertical length X with respect to the axial direction of the horizontal portion (34) from a corner apex portion (33), and a vertical cross section (horizontal portion side cross section of the analysis sample; 37) vertical to an axial direction of the vertical rod portion (36) at a position (A2) where an outer end side of the horizontal portion was laterally moved by a length (1.2Y) of about 1.2 times the a vertical length Y with respect to the axis direction of the vertical rod portion (36) from the corner apex portion (33) toward the other corner junction side. This cutting was performed by cutting out a notch (39) at each of the positions A1 and A2 of the silicon core wire by using a polycrystalline silicon piece, and striking peripheries of the notches (39). A width of a joined portion in the analysis sample obtained from the corner junction was measured with a caliper and recorded. A cross-sectional area of the joined portion before welding has been recorded. As a blank sample, a fragment that does not include the joined portion was cut out by a length at which the blank sample had a weight approximately same as that of the analysis sample. The weight of each of the samples was measured.

Next, the analysis sample and the blank sample were immersed in a fluoronitric acid solution tank (room temperature), and surfaces thereof were dissolved at a depth of 100 micrometers. This dissolution depth was attained by preliminary confirming a required dissolution treatment time according to a method described in WO2018/198947 pamphlet. A metal component amount (weight) of each of the obtained solutions was measured by ICP-MS, and a surface metallic concentration Ca (ppbw) of the analysis sample and a surface metallic concentration Cb (ppbw) of the blank sample were obtained by dividing the obtained metal component amounts by the weights of respective samples. A weight Wa of the welded portion in the analysis sample is obtained based on a width d of the welded portion, a cross-sectional area S of a welded surface, and a specific gravity 2.33 of silicon, and since a weight Wb of a non-welded portion in the analysis sample is in a relation of Wb=W−Wa with respect to a weight W of the analysis sample, Wb is obtained. Since a surface metal concentration N of the welded portion, the surface metallic concentration Ca of the analysis sample, the surface metal concentration Cb of the blank sample, Wa, and Wb were in a relation of N=Ca×W/Wa−Cb×Wb/Wa, the surface metallic concentration N (ppbw) of the welded portion of the corner junction was obtained.

A simple calculation example is shown below. When the weight W of the analysis sample is 1.0 g, the weight Wa of the welded portion is 0.1 g, the weight Wb of the non-welded portion of the analysis sample is 0.9 g, the surface metallic concentration Ca of the analysis sample is 1 ppbw, and the surface metallic concentration Cb of the blank sample is 0.1 ppbw, the surface metallic concentration N of the welded portion of the corner junction can be obtained by the following calculation.

Calculation Example

Weight: analysis sample W=1.0 g, welded portion Wa=0.1 g, non-welded portion Wb=0.9 g ICP-MS measurement value: analysis sample Ca=1 ppbw, blank sample Cb=0.1 ppbw The surface metallic concentration $N$ of the welded portion=1 ppbw×(1 g/0.1 g)−0.1 ppbw×(0.9 g/0.1 g)=10−0.9=9.1 ppbw 2) Metal Content in Carbon Member Approximately 1 g of a sample piece collected from a carbon member was placed on a platinum board, heated in an oxygen atmosphere and burnt to be ashed, and a residue was dissolved in 5 ml of nitric acid to measure a metal element weight of 18 elements of iron, chromium, nickel, sodium, magnesium, aluminum, potassium, calcium, cobalt, copper, zinc, tungsten, titanium, molybdenum, vanadium, manganese, strontium, and barium by ICP-MS, and each metal amount is divided by the weight of the sample piece to obtain a metal concentration in the carbon member.

3) Yield of Polycrystalline Silicon Containing No Popcorn when Producing Polycrystalline Silicon Rod Eight silicon core wires for depositing polycrystalline silicon were set on a bottom plate of the polycrystalline silicon production reactor illustrated in the cross-sectional view in FIG. 2, initial energization was carried out, then a raw material gas composed of a mixed gas containing trichlorosilane and hydrogen was supplied into a bell jar, and a deposition reaction of polycrystalline silicon onto each silicon core wire was continued by a Siemens method. After a diameter was grown to 150 mm, each of the obtained polycrystalline silicon rods was taken out, a surface thereof was observed, a portion containing popcorn and a portion containing no popcorn were distinguished from each other, and a weight of the portion containing no popcorn was added to a weight of polycrystalline silicon where the popcorn on the surface was removed from the portion containing the popcorn, the obtained weight was divided by a weight of a total polycrystalline silicon obtained by the deposition reaction, and the weight obtained by dividing was evaluated as a yield of the polycrystalline silicon containing no popcorn.

Example 1

By cutting out from a high-purity polycrystalline silicon rod obtained by a Siemens method, two vertical rod portion silicon rods each having a length of 1500 mm and one horizontal portion silicon rod having a length of 250 mm each having a cross section of 8 mm square were prepared. These vertical rod portion silicon rods and horizontal portion silicon rod were subjected to an etching treatment with a fluoronitric acid solution in a surface cleaning apparatus installed in a clean room, washed with pure water, dried, and then stored in the same clean room.

As a silicon core wire welding apparatus to perform high-frequency induction heating, an apparatus in which a work coil and a preheating carbon portion had the structure described in [Embodiment 2] in Patent Literature 7 as illustrated in FIG. 4 was used. Here, a carbon member forming the above preheater had a metallic concentration of 215 ppbw, in which iron concentration was 34 ppbw, chromium concentration was 3 ppbw, nickel concentration was 42 ppbw, and titanium concentration was 17 ppbw.

By this silicon core wire welding apparatus, the pair of vertical rod portion silicon rods and the horizontal portion silicon rod were joined into a gate shape to produce a silicon core wire for depositing polycrystalline silicon. In the high-frequency induction heating, the frequency was 2 MHz, and the maximum output was 5 kW. The work coil had a tubular structure having an outer diameter of approximately 2 mm, and cooling water flowed inside the tube. The width of the first inverted U-shaped portion (44a) and the second inverted U-shaped portion (44b), and an interval between the first inverted U-shaped portion (44a) and the second inverted U-shaped portion (44b) facing each other were all 10 mm. The carbon member forming the preheater (41) had a thickness of 1.0 mm. A welding chamber in which the work coil (43) and the preheater (41) were accommodated had a SUS cubic structure, in which an upper wall was openable.

In this silicon core wire welding apparatus, the preheater (41) was inserted into the work coil (43) so as to be parallel to a plane formed by the first inverted U-shaped portion (44a) and a plane formed by the second inverted U-shaped portion (44b) of the work coil (43), with a C-shaped opening facing a traveling direction.

Next, one end of one of the pair of vertical rod portion silicon rods and one end of the horizontal portion silicon rod were brought into contact with each other at a right angle as in the form illustrated in FIG. 3 to obtain the portion to be joined. The above vertical rod portion silicon rod and horizontal portion silicon rod abutted against each other were accommodated in the welding chamber in which a pretreatment has been performed by the preheater (41), and the portion to be joined (45) was inserted from an open space above the work coil (43), and was installed inside the C-shape of the preheater. In the operation of installing the portion to be joined (45), the portion to be joined (45) did not come into contact with the preheater (41) and the work coil (43) at all.

After the above installation of the portion to be joined (45), the welding chamber was sealed and filled with argon, and then argon was flown from one wall to an opposite wall at a flow rate of 20 L/min. Then, 1) preheating by the preheater was started. In the high-frequency induction heating, the frequency was 2 MHz, and the maximum output was 5 KW. Due to the high-frequency induction heating, the preheater was heated (approximately 1500° C. to 2000° C.) inside the work coil (43). Approximately 3 minutes later, the high frequency began to act on the portion to be joined (45) formed by silicon rods, causing a high frequency voltage drop that is a signal as final stage of preheating, and thus the preheater (41) was retracted from the inside of the work coil (43).

By retracting the preheater (41) from the inside of the work coil (43) in this way, the high frequency from the work coil (43) was concentrated on the portion to be joined (45), and the 2) high-frequency induction heating of the portion to be joined (45) was started. With a molten liquid of silicon visually confirmed on the portion to be joined (45) as the end of the 2) high-frequency induction heating, an output of the high frequency was reduced to zero, and the portion to be joined (45) was cooled. After 10 minutes had passed, the welding chamber was open, the above portion to be joined

(45) in the work coil (43) was retracted from the open space above the work coil so as to take the welded joint formed by the vertical rod portion silicon rods and the horizontal portion silicon rod out of the welding chamber.

Further, joining of the other end of the horizontal portion silicon rod that was not joined to the vertical rod portion silicon rod and an end of the remaining one of the pair of vertical rod portion silicon rods was carried out by the same welding operation by the high-frequency induction heating. With respect to the obtained silicon core wire for depositing polycrystalline silicon, surface metallic concentrations of corner junctions formed by the ends of the vertical rod portions and the ends of the horizontal portion (the vertical rod portion-horizontal portion corner junctions: 15a, 15b) were measured, and as shown in Table 1, the surface metallic concentrations were extremely low. As a result, a silicon core wire for depositing polycrystalline silicon was produced in which surface metal contamination of both corner junctions was reduced.

TABLE 1

| Vertical rod portion-horizontal portion corner junction | Surface metallic concentration of corner junction (ppbw) | | | | | | | | | | | | | | | | | | Total surface metallic concentration (ppbw) |
|---|---|---|---|---|---|---|---|---|---|---|---|---|---|---|---|---|---|---|---|
| | Na | Mg | Al | K | Ca | Cr | Fe | Ni | Co | Cu | Zn | W | Ti | Mo | V | Mn | Sr | Ba | |
| 15a | 0.02 | 0.02 | 0.05 | 0.03 | 0.01 | 0.02 | 0.08 | 0.02 | 0.01 | 0.02 | 0.03 | 0.01 | 0.11 | 0.01 | 0.01 | 0.02 | 0.01 | 0.02 | 0.49 |
| 15b | 0.02 | 0.03 | 0.03 | 0.03 | 0.01 | 0.04 | 0.06 | 0.03 | 0.01 | 0.02 | 0.03 | 0.01 | 0.08 | 0.01 | 0.01 | 0.02 | 0.01 | 0.01 | 0.46 |

When the polycrystalline silicon rod was produced by the Siemens method by using the silicon core wire for depositing polycrystalline silicon, a yield of polycrystalline silicon containing no popcorn in the polycrystalline silicon rod was found to be 81%.

Comparative Examples 1 to 4

Silicon core wires for depositing polycrystalline silicon were produced in the same manner as in Example 1, except that a metallic concentration of a carbon member forming a preheater in a silicon core wire welding apparatus used was changed to values shown in Table 2. Measured surface metallic concentrations of corner junctions of joints formed by vertical rod portion silicon rods and a horizontal portion silicon rod obtained in the silicon core wire production process were also shown in Table 2.

TABLE 2

| | Metallic concentration in carbon member (ppmw) | | | | Total metallic concentration in carbon member (ppmw) | Vertical rod portion-horizontal portion corner junction | Metallic concentration of welded portion (ppbw) | | | | Total surface metallic concentration (ppbw) |
|---|---|---|---|---|---|---|---|---|---|---|---|
| | Fe | Cr | Ni | Ti | | | Cr | Fe | Ni | Ti | |
| Comparative Example 1 | 2.6 | 0.5 | 0.8 | 0.8 | 6.7 | 15a | 0.08 | 2.65 | 0.88 | 0.18 | 4.6 |
| | | | | | | 15b | 0.07 | 2.74 | 0.92 | 0.22 | 4.9 |
| Comparative Example 2 | 1.2 | 3.4 | 8.6 | 0.06 | 16.3 | 15a | 1.66 | 1.85 | 1.37 | 0.47 | 6.6 |
| | | | | | | 15b | 2.10 | 1.62 | 1.15 | 0.39 | 6.5 |
| Comparative Example 3 | 1.1 | 0.5 | 2.3 | 0.5 | 5.5 | 15a | 0.77 | 1.44 | 0.08 | 0.18 | 3.8 |
| | | | | | | 15b | 0.67 | 1.52 | 0.10 | 0.33 | 3.9 |
| Comparative Example 4 | 0.5 | 0.5 | 1.3 | 6.6 | 10.9 | 15a | 0.08 | 0.18 | 1.11 | 2.41 | 4.7 |
| | | | | | | 15b | 0.07 | 0.12 | 1.43 | 3.33 | 5.8 |

Examples 2 to 6

In Example 1, the silicon core wire for depositing polycrystalline silicon was produced by using the horizontal portion formed by joining a plurality of horizontal portion silicon rod members into an upward bent shape by welding. The number of the horizontal portion silicon rod members was shown in Table 3, and angles of the corner junctions in the middle of the obtained horizontal portion (horizontal portion intermediate corner junctions: 56a, 56b, 56c, 56d, 56e) were set to values shown in Table 3, which were equally set to each corners at the same angle. Further, corner junctions formed by joining ends of the horizontal portion and ends of the vertical rod portion silicon rods (vertical rod portion-horizontal portion corner junctions: 55a, 55b) were also set to values shown in Table 3.

An operation for joining the ends of the horizontal portion silicon rod members was carried out in the same manner as the welding of the ends of the vertical rod portion silicon rods and the horizontal portion silicon rod in Example 1, and other operations for producing the silicon core wire were also performed in the same manner as in Example 1.

Regarding each of the obtained silicon core wires for depositing polycrystalline silicon, the surface metallic concentrations of the vertical rod portion-horizontal portion corner junctions and the horizontal portion intermediate corner junctions were shown in Table 3.

Further, when polycrystalline silicon rods were produced by the Siemens method by using the silicon core wire for depositing polycrystalline silicon, results of the yields of polycrystalline silicon containing no popcorn in these polycrystalline silicon rods were also shown in Table 3.

TABLE 3

| | Number of horizontal rod portion silicon rod member | Angle of horizontal portion intermediate corner junction | Angle of vertical rod portion-horizontal portion corner junction | Corner junction | Surface metallic concentration of welded portion (ppbw) | | | | Total surface metallic concentration (ppbw) | Yield (%) |
|---|---|---|---|---|---|---|---|---|---|---|
| | | | | | Cr | Fe | Ni | Ti | | |
| Example 2 | 2 | 100 degrees | 130 degrees | Vertical rod portion-horizontal portion corner junction 55a | 0.07 | 0.08 | 0.02 | 0.07 | 0.47 | 91 |
| | | | | Vertical rod portion-horizontal portion corner junction 55b | 0.08 | 0.12 | 0.02 | 0.14 | 0.66 | |
| | | | | Horizontal portion intermediate corner junction 56a | 0.07 | 0.09 | 0.02 | 0.09 | 0.51 | |
| Example 3 | 3 | 135 degrees | 135 degrees | Vertical rod portion-horizontal portion corner junction 55a | 0.06 | 0.08 | 0.01 | 0.05 | 0.45 | 94 |
| | | | | Vertical rod portion-horizontal portion corner junction 55b | 0.06 | 0.11 | 0.01 | 0.09 | 0.66 | |
| | | | | Horizontal portion intermediate corner junction 56a | 0.07 | 0.14 | 0.01 | 0.06 | 0.69 | |
| | | | | Horizontal portion intermediate corner junction 56b | 0.06 | 0.13 | 0.02 | 0.08 | 0.73 | |
| Example 4 | 6 | 150 degrees | 165 degrees | Vertical rod portion-horizontal portion corner junction 55a | 0.07 | 0.1 | 0.01 | 0.11 | 0.71 | 97 |
| | | | | Vertical rod portion-horizontal portion corner junction 55b | 0.06 | 0.10 | 0.01 | 0.13 | 0.81 | |
| | | | | Horizontal portion intermediate corner junction 56a | 0.07 | 0.09 | 0.01 | 0.11 | 0.65 | |
| | | | | Horizontal portion intermediate corner junction 56b | 0.05 | 0.07 | 0.02 | 0.09 | 0.47 | |
| | | | | Horizontal portion intermediate corner junction 56c | 0.06 | 0.11 | 0.01 | 0.012 | 0.41 | |
| | | | | Horizontal portion intermediate corner junction 56d | 0.07 | 0.12 | 0.02 | 0.01 | 0.56 | |
| | | | | Horizontal portion intermediate corner junction 56e | 0.08 | 0.08 | 0.03 | 0.08 | 0.67 | |

TABLE 3-continued

| | Number of horizontal rod portion silicon rod member | Angle of horizontal portion intermediate corner junction | Angle of vertical rod portion-horizontal portion corner junction | Corner junction | Surface metallic concentration of welded portion (ppbw) | | | | Total surface metallic concentration (ppbw) | Yield (%) |
|---|---|---|---|---|---|---|---|---|---|---|
| | | | | | Cr | Fe | Ni | Ti | | |
| Example 5 | 2 | 60 degrees | 150 degrees | Vertical rod portion-horizontal portion corner junction 55a | 0.06 | 0.13 | 0.02 | 0.08 | 0.51 | 81 |
| | | | | Vertical rod portion-horizontal portion corner junction 55b | 0.07 | 0.09 | 0.01 | 0.09 | 0.43 | |
| | | | | Horizontal portion intermediate corner junction 56a | 0.07 | 0.08 | 0.03 | 0.10 | 0.61 | |
| Example 6 | 3 | 100 degrees | 170 degrees | Vertical rod portion-horizontal portion corner junction 55a | 0.08 | 0.09 | 0.01 | 0.11 | 0.78 | 82 |
| | | | | Vertical rod portion-horizontal portion corner junction 55b | 0.06 | 0.11 | 0.01 | 0.12 | 0.82 | |
| | | | | Horizontal portion intermediate corner junction 56a | 0.06 | 0.13 | 0.01 | 0.08 | 0.81 | |
| | | | | Horizontal portion intermediate corner junction 56b | 0.08 | 0.08 | 0.02 | 0.11 | 0.8 | |

REFERENCE SIGNS LIST

11 Silicon core wire
12a, 12b Vertical rod portion
13 Horizontal portion
14a, 14b Joined portion (welded portion)
15a, 15b Vertical rod portion-horizontal portion corner junction
21 Polycrystalline silicon production reactor
22 Bottom plate [bottom board]
23 Bell jar-type cover
24 Metal electrode
25 Power supply unit
26 Raw material gas supply port
27 Waste gas discharge port
28 Silicon core wire
29 Polycrystalline silicon rod
31 Silicon core wire upper portion
32 corner junction
33 Corner apex portion
34 Horizontal portion
35 Vertical rod portion side cross section of analysis sample
36 Vertical rod portion
37 Horizontal portion side cross section of analysis sample
38 Analysis sample
41 Preheater
43 Work coil
44a First inverted U-shaped portion
44b Second inverted U-shaped portion
45 Portion to be joined
P1, P2 Silicon core wire
51 Silicon core wire upper portion
52a, 52b Vertical rod portion
53 Horizontal portion
53a, 53b, 53c Horizontal portion silicon rod member
54 Joined portion
55a, 55b Vertical rod portion-horizontal portion corner junction
56a, 56b, 56c, 56d, 56e Horizontal portion intermediate corner junction
α Angle of vertical rod portion-horizontal portion corner junction
β Angle of horizontal portion intermediate corner junction

The invention claimed is:

1. A silicon core wire for depositing polycrystalline silicon formed in a gate shape, comprising:
    a pair of vertical rod portions; and
    a horizontal portion laterally connecting upper ends of the two vertical rod portions,
    wherein ends of the vertical rod portions and the horizontal portion are joined by welding, and a metallic concentration from a surface of a corner junction to a depth of 100 micrometers is 1 ppbw or less, and
    wherein in the metallic concentration from a surface of a corner junction to a depth of 100 micrometers, an iron concentration is 0.2 ppbw or less, a chromium concentration is 0.1 ppbw or less, a nickel concentration is 0.05 ppbw or less, and a titanium concentration is 0.2 ppbw or less.

2. The silicon core wire for depositing polycrystalline silicon according to claim 1, wherein the metallic concentration from the surface of the corner junction to a depth of 100 micrometers is a total concentration of iron, chromium, nickel, sodium, magnesium, aluminum, potassium, calcium, cobalt, copper, zinc, tungsten, titanium, molybdenum, vanadium, manganese, strontium, and barium.

3. The silicon core wire for depositing polycrystalline silicon according to claim 1, wherein
the horizontal portion is formed by joining at least two horizontal portion silicon rod members into an upward bent shape, and
at least one joint of ends of the horizontal portion silicon rod members, which is present in a middle of the horizontal portion, is formed by welding, and a metallic concentration from a surface of a corner junction in the middle of the horizontal portion to a depth of 100 micrometers is 1 ppbw or less.

4. The silicon core wire for depositing metallic concentration according to claim 3, wherein the metallic concentration from the surface of the corner junction in the middle of the horizontal portion to a depth of 100 micrometers is a total concentration of iron, chromium, nickel, sodium, magnesium, aluminum, potassium, calcium, cobalt, copper, zinc, tungsten, titanium, molybdenum, vanadium, manganese, strontium, and barium.

5. The silicon core wire for depositing polycrystalline silicon according to claim 3, wherein an angle of each of corner junctions formed by the ends of the vertical rod portions and the horizontal portion is formed larger than a right angle, and an angle of the at least one corner junction present in the middle of the horizontal portion is 90 degrees or more and 170 degrees or less.

6. The silicon core wire for depositing polycrystalline silicon according to claim 5, wherein the horizontal portion is formed by joining three to six horizontal portion silicon rod members into an upward bent shape, and the corner junctions formed by the ends of the vertical rod portions and the horizontal portion and the corner junction in the middle of the horizontal portion all have an angle of 130 degrees or more and 170 degrees or less.

7. A method for producing the silicon core wire for depositing polycrystalline silicon according to claim 1, comprising:
joining the pair of vertical rod portion silicon rods and the horizontal portion silicon rod into the gate shape, wherein
the ends of the vertical rod portion silicon rods and the horizontal portion silicon rod are joined to each other, in an inert gas atmosphere, by
1) preheating by a preheater formed of a carbon member having a metallic concentration of 1 ppmw or less, and
2) welding by performing high-frequency induction heating.

8. The method for producing a silicon core wire for depositing polycrystalline silicon according to claim 7, wherein a portion to be joined including the ends of the vertical rod portion silicon rods and the horizontal portion silicon rod is joind by welding without being brought into contact with the preheater and a work coil for the high-frequency induction heating at all.

9. The method for producing a silicon core wire for depositing polycrystalline silicon according to claim 3, wherein
the horizontal portion is formed by joining at least two horizontal portion silicon rod members into an upward bent shape, and
ends of the horizontal portion silicon rod members are joined to each other, in an inert gas atmosphere, by
1) preheating by the preheater formed of the carbon member having a metallic concentration of 1 ppmw or less, and
2) welding by performing the high-frequency induction heating.

10. The method for producing a silicon core wire for depositing polycrystalline silicon according to claim 9, wherein a portion to be joined including the ends of the horizontal portion silicon rod members is joind by welding without being brought into contact with the preheater and the work coil for the high-frequency induction heating at all.

11. The production method according to claim 7, wherein a metallic concentration of the preheater is a total concentration of iron, chromium, nickel, sodium, magnesium, aluminum, potassium, calcium, cobalt, copper, zinc, tungsten, titanium, molybdenum, vanadium, manganese, strontium, and barium.

12. The production method according to claim 7, wherein in the carbon member forming the preheater, an iron concentration is 50 ppbw or less, a chromium concentration is 5 ppbw or less, a nickel concentration is 50 ppbw or less, and a titanium concentration is 30 ppbw or less.

* * * * *